US008666732B2

(12) United States Patent
Sato et al.

(10) Patent No.: US 8,666,732 B2
(45) Date of Patent: Mar. 4, 2014

(54) HIGH FREQUENCY SIGNAL INTERPOLATING APPARATUS

(75) Inventors: Yasushi Sato, Fukuoka (JP); Atsuko Ryu, Fukuoka (JP)

(73) Assignee: Kyushu Institute of Technology, Fukuoka (JP)

( * ) Notice: Subject to any disclaimer, the term of this patent is extended or adjusted under 35 U.S.C. 154(b) by 796 days.

(21) Appl. No.: 12/311,367

(22) PCT Filed: Oct. 16, 2007

(86) PCT No.: PCT/JP2007/070174
§ 371 (c)(1),
(2), (4) Date: Mar. 27, 2009

(87) PCT Pub. No.: WO2008/047793
PCT Pub. Date: Apr. 24, 2008

(65) Prior Publication Data

US 2010/0023333 A1 Jan. 28, 2010

(30) Foreign Application Priority Data

Oct. 17, 2006 (JP) ................................ 2006-282830

(51) Int. Cl.
*G10L 19/02* (2013.01)
*H03K 5/24* (2006.01)

(52) U.S. Cl.
USPC ............ 704/205; 704/206; 704/500; 327/91; 381/94.4

(58) Field of Classification Search
USPC .......... 704/203, 205, 211, 500, 206; 708/290, 708/313; 327/91; 381/94.4
See application file for complete search history.

(56) References Cited

U.S. PATENT DOCUMENTS

| | | | | |
|---|---|---|---|---|
| 3,759,097 A * | 9/1973 | Cushing | ..................... | 73/861.15 |
| 3,824,470 A * | 7/1974 | Eastmond | ..................... | 455/701 |
| 4,004,234 A * | 1/1977 | Juvinall | ..................... | 307/652 |
| 4,319,813 A * | 3/1982 | Aoki et al. | ..................... | 396/127 |

(Continued)

FOREIGN PATENT DOCUMENTS

| | | |
|---|---|---|
| JP | 02-311006 A | 12/1990 |
| JP | 3538122 B2 | 3/2004 |

(Continued)

OTHER PUBLICATIONS

F. R. Stancel, "Some Analyses of Wave Shapes Used in Harmonic Producers", Bell System Technical Journal, vol. 20, Issue 3, Jun. 1941, pp. 331 to 339.*

(Continued)

*Primary Examiner* — Martin Lerner
(74) *Attorney, Agent, or Firm* — Rader, Fishman & Grauer PLLC

(57) ABSTRACT

A high frequency signal interpolation apparatus provides, with a simple structure, a high-quality digital audio signal through interpolation of high frequency signals missing due to compression. The high frequency signal interpolation apparatus includes a peak value detection and holding circuit configured to detect a peak value of a digital audio signal provided to an input terminal by sampling the digital audio signal and generate a square wave signal by holding the detected peak value; a high-pass filter configured to extract a higher harmonic component from the generated square wave signal; and an adder configured to add the extracted higher harmonic component to the digital audio signal provided to the input terminal.

8 Claims, 3 Drawing Sheets

(56) References Cited

U.S. PATENT DOCUMENTS

| | | | | |
|---|---|---|---|---|
| 4,682,123 | A * | 7/1987 | Loper et al. | 332/100 |
| 5,172,071 | A * | 12/1992 | Braathen | 330/129 |
| 5,195,105 | A * | 3/1993 | Hashimoto et al. | 375/150 |
| 5,579,404 | A * | 11/1996 | Fielder et al. | 381/106 |
| 5,638,403 | A * | 6/1997 | Birchler et al. | 375/296 |
| 5,805,574 | A * | 9/1998 | Jan et al. | 370/329 |
| 6,084,974 | A * | 7/2000 | Niimi | 381/104 |
| 6,895,375 | B2 * | 5/2005 | Malah et al. | 704/219 |
| 7,020,604 | B2 * | 3/2006 | Kuwaoka | 704/206 |
| 7,289,963 | B2 * | 10/2007 | Iwasaki et al. | 704/500 |
| 7,324,024 | B2 * | 1/2008 | Fujiyama et al. | 341/61 |
| 7,477,591 | B2 * | 1/2009 | Hsiao | 369/124.15 |
| 7,523,037 | B2 * | 4/2009 | Sakata | 704/272 |
| 8,036,394 | B1 * | 10/2011 | Yonemoto et al. | 704/500 |
| 8,301,281 | B2 * | 10/2012 | Sato et al. | 700/94 |
| 2003/0044024 | A1 * | 3/2003 | Aarts et al. | 381/61 |
| 2003/0125889 | A1 | 7/2003 | Sato | |
| 2003/0149560 | A1 * | 8/2003 | Chen | 704/207 |
| 2004/0098431 | A1 * | 5/2004 | Sato | 708/290 |
| 2005/0245221 | A1 * | 11/2005 | Beyer | 455/222 |
| 2006/0267825 | A1 * | 11/2006 | Fujiyama et al. | 341/155 |
| 2007/0011001 | A1 * | 1/2007 | Kim | 704/219 |
| 2007/0088541 | A1 * | 4/2007 | Vos et al. | 704/219 |
| 2007/0110130 | A1 * | 5/2007 | Kang et al. | 375/147 |
| 2009/0003497 | A1 * | 1/2009 | Kino et al. | 375/346 |
| 2009/0024399 | A1 * | 1/2009 | Gartner et al. | 704/500 |
| 2009/0259476 | A1 * | 10/2009 | Sato | 704/500 |
| 2010/0057230 | A1 * | 3/2010 | Sato et al. | 700/94 |

FOREIGN PATENT DOCUMENTS

| | | | |
|---|---|---|---|
| JP | 2004-184472 | A | 7/2004 |
| JP | 2004-266358 | A | 9/2004 |
| JP | 2007-025480 | A | 2/2007 |

OTHER PUBLICATIONS

J. Donald Tillman, "A Quadrature Trapezoid Voltage Controlled Oscillator", 8 Pages, Mar. 1, 2004, downloaded from http://www.till.com/articles/QuadTrapVCO/trapezoid.html.*

International Search Report mailed on Nov. 13, 2007.

* cited by examiner

HIGH FREQUENCY SIGNAL INTERPOLATING APPARATUS

TECHNICAL FIELD

The present invention relates to a high frequency signal interpolation apparatus suitably used for telephones, digital audio apparatus etc., which carry out MP3 data compression, for example. More in detail, the present invention approximately interpolates a missing part of high frequency signals due to some compression etc.

BACKGROUND ART

According to conventional high frequency signal interpolation, an interpolation signal is generated through frequency conversion of a signal to be interpolated, as disclosed in Japanese Unexamined Patent Application Publication No. 2004-184472 (hereafter referred to as Patent Document 1). Moreover, as disclosed in Japanese Unexamined Patent Application Publication No. Hei 1-131400 (hereafter referred to as Patent Document 2), a high frequency signal without correlation with an original signal is added. That is, the conventional high frequency signal interpolation is carried out through frequency conversion and thereby generating an interpolation signal, or adding a high frequency signal without correlation with an original signal.

DISCLOSURE OF INVENTION

In recent years, it is popular that audio data representing music etc. is distributed through networks, such as the Internet, and that media such as MDs (Mini Disk) etc. on which music etc. is recorded are available. Of audio data such as music etc. recorded on a medium or delivered through some networks, a specified frequency component and higher frequency components to be supplied are removed so as to prevent increase in data volume due to an excess band width and prevent excess expansion of the occupation band width.

Namely, of audio data in MP3 (MPEG1 audio layer 3) format, for example, a frequency component of approximately 16 kHz or higher frequency components are removed. Moreover, of audio data in ATRAC3 (Adaptive TRansform Acoustic Coding 3) format, a frequency component of approximately 14 kHz or higher frequency components are removed.

Such removal of high frequency components emanates from the fact that it is understood that frequency components exceeding the human's audible region are unnecessary. However, it is pointed out that sound quality of signals whose high frequency components are removed completely as mentioned above changes subtly, and sound quality is degraded in comparison to the original music etc.

Accordingly, removed high frequency components of signals are interpolated according to Patent Documents 1 and 2 mentioned above. On the other hand, the technique disclosed in Patent Documents 1 requires use of a complicated circuit including a DSP (Digital Signal Processor) etc. for frequency conversion. Meanwhile, the technique according to Patent Document 2 cannot provide sufficient results due to high frequency signals without correlation.

On the other hand, the inventor(s) has filed this invention: Japanese Patent Application No. 2005-210124 (Refer to Japanese Patent Publication No. 2007-25480), which picks up higher harmonics of envelope components of the original signal and then interpolates the missing high frequency components. According to this prior invention, interpolation of very high-quality sounds may be carried out, and this prior invention has been highly rated and applied to commercial audio apparatus.

However, this prior invention requires relatively a large number of calculations for the Hilbert transform and calculating a square root for extracting higher-harmonic components. This causes a problem of an increased load on the processing circuit (CPU) in, especially, a small-sized apparatus when both those calculations and other processing (image displaying etc.) must be carried out only by the processing circuit. Moreover, strengthening the capability of the processing circuit only for this reason is not preferable economically because it requires implementation of an expensive circuit.

This invention is devised in light of such problems, and aims to provide a simple structure allowing quality high frequency signal interpolation.

Namely, in order to solve these problems and achieve the objective of the prevent invention, an aspect of the present invention is characterized by a high frequency signal interpolation apparatus, including: a peak value detection and holding circuit configured to detect numerous peak values of an original audio signal, generate a square wave signal by holding each peak value until the next peak value is detected, and output the generated square wave signal; and a high pass filter configured to remove a higher harmonic component from the square wave signal, an extracted higher harmonic component being the higher harmonic component that has been removed from the square wave signal.

The high frequency signal interpolation apparatus is characterized by the detector for detecting the peak value comprising a means of detecting a middle value of three sampling consecutive values when the middle value is equal to or greater than the previous value and is greater than the following value.

The high frequency signal interpolation apparatus is characterized in that the original signal provided to the input terminal is provided to the adder via a means for carrying out frequency band regulation so as not to include the higher harmonic component.

The high frequency signal interpolation apparatus is characterized in that the original signal provided to the input terminal is subjected to frequency band regulation beforehand so as not to include the higher harmonic component.

With such a processing structure according to the present invention, a higher harmonic component is extracted from the square wave generated by holding a peak value of an original signal, and interpolation is then carried out. Therefore, a quality, high frequency signal may be provided by a very simple processing structure, and practical high frequency signal interpolation is possible without increasing a load on a processing circuit.

BEST MODE FOR CARRYING OUT THE INVENTION

Figure 1:
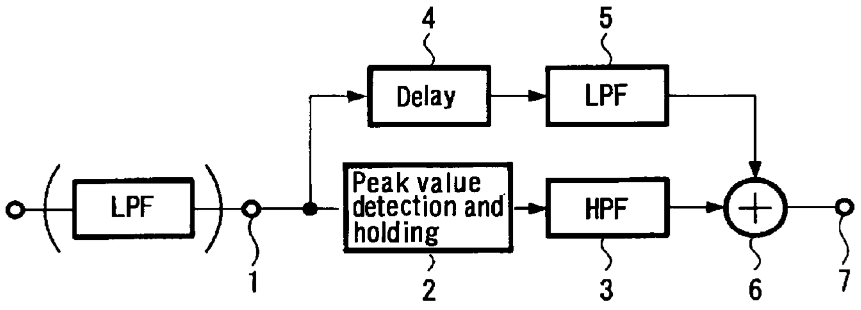
FIG. 1 is a block diagram showing an apparatus according to an embodiment of the present invention to which is applied a high frequency signal interpolation apparatus.

The present invention is explained with reference to drawings forthwith; wherein FIG. 1 is a block diagram showing a structure of an apparatus according to an embodiment to which is applied a high frequency signal interpolation apparatus according to the present invention.

With reference to FIG. 1, a digital audio signal reproduced by an apparatus carrying out MP3 or ATRAC3 compression, for example, is provided as an original signal to an input terminal 1. The original signal provided to this input terminal 1 is sent to the peak value detection and holding circuit 2, which detects and holds a peak value and then generates a square wave signal. This square wave signal includes a higher harmonic component. This square wave signal is then sent to a high pass filter (HPF) 3, which extracts the higher harmonic component.

Meanwhile, the original signal from the input terminal 1 is given to a delay circuit 4, which then delays it for an equivalent duration to the processing time of the above-mentioned peak value detection and holding circuit 2, and the resulting aligned, delayed signal is sent to a low pass filter (LPF) 5, which then extracts a high frequency component-removed signal. Output signals from the high pass filter 3 and the low pass filter 5 are added by an adder 6, which then outputs the resulting added signal to an output terminal 7. As a result, a high frequency signal superimposed (and intensified) signal is output from the output terminal 7.

With such processing, high frequency component interpolation of a digital audio signal reproduced by an apparatus, which also carries out MP3 or ATRAC3 compression, for example, is carried out. By adding a high frequency component of the square wave signal generated by the peak value holding circuit 2 to the high frequency component-removed original signal, interpolation for a high frequency signal may be carried out.

Figure 2:
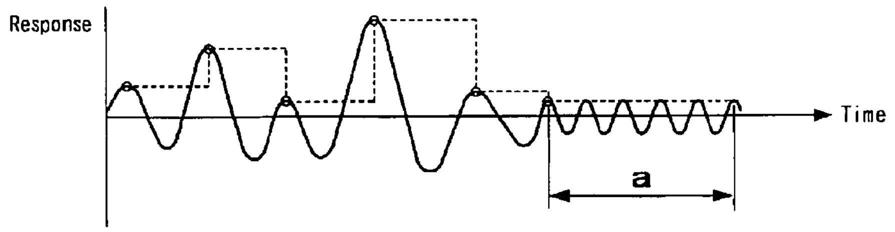
FIG. 2 shows a wave form for explanation thereof.

That is, when the original signal input to the input terminal 1 has a wave form indicated by a solid line in FIG. 2, for example, peak values of this original signal may be detected at respective points, each marked with O in the figure. These peak values are then held, thereby generating a square wave signal as indicated by a dashed line in the figure. This square wave signal includes a high frequency component. This high frequency component is extracted and added to the original signal, resulting in an interpolated high frequency signal.

Note that as shown in FIG. 2, during the period with a symbol 'a' in which the original signal (solid line) has a fixed amplitude, no higher harmonic component exists therein. Such a signal, however, is understood to include few original high-frequency components, which means that the present invention faithfully reproduces such a signal. Moreover, a changed original signal in frequency is output through the low pass filter 5 even during this period a.

Figure 3A:
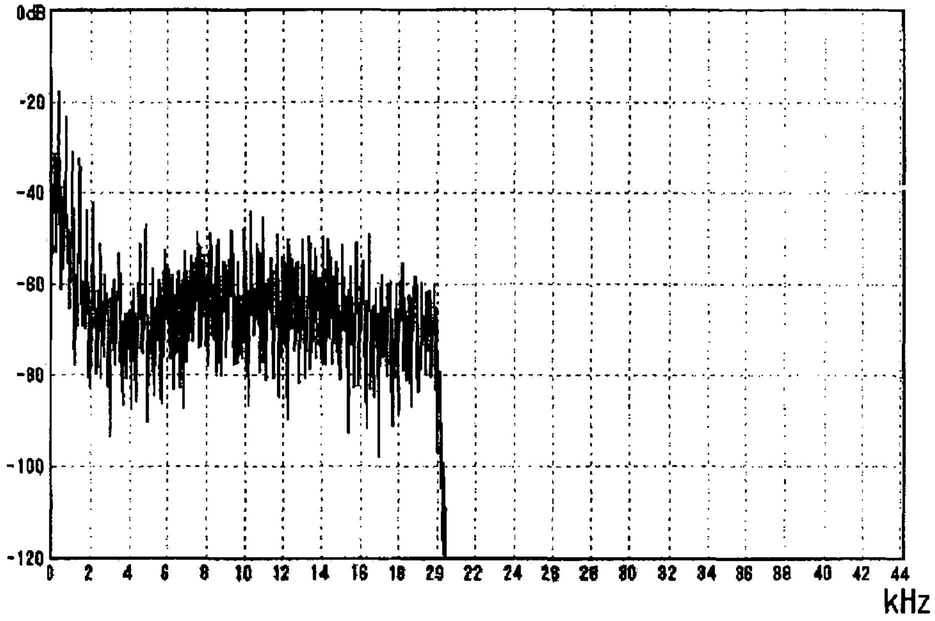
FIGS. 3A and 3B show wave forms for explanation of results thereof.
Figure 3B:
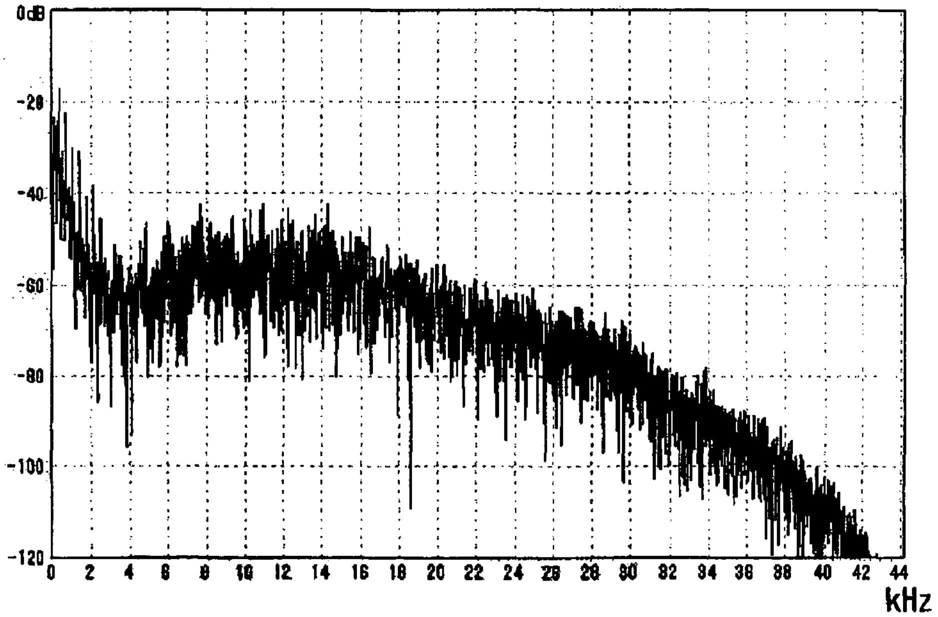

In this case, since higher harmonic components included in the envelope components mentioned above are approximate to the characteristic of the original signal, higher harmonic component interpolation makes it possible to interpolate high frequency signals extremely well. Note that FIG. 3A shows a signal before interpolation while FIG. 3B shows a signal after interpolation. As is apparent from FIGS. 3A and 3B, the present invention can provide quality, high frequency signal interpolation.

Figure 4:
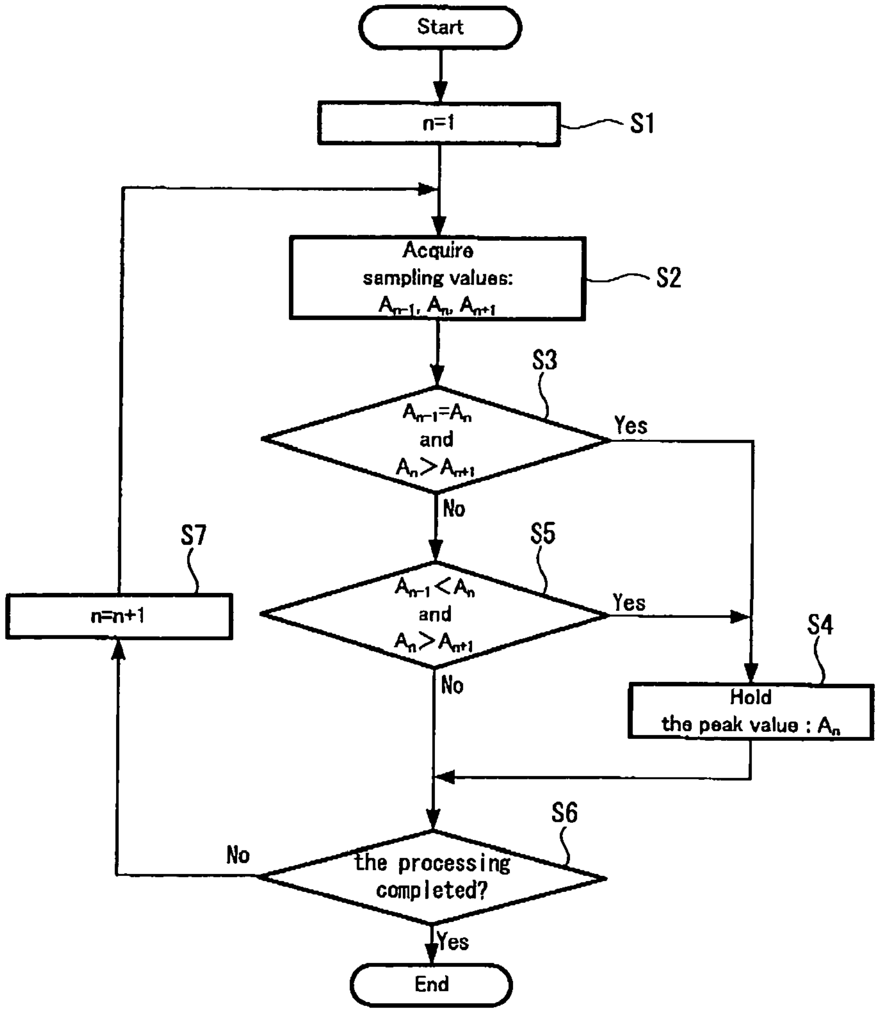
FIG. 4 is a flow chart showing processing of a peak value detection and holding circuit.

Furthermore, in the circuit configuration shown in FIG. 1 described above, the peak value detection and holding circuit 2 may be implemented with simple calculation processing shown in a flowchart of FIG. 4, for example. That is, with reference to FIG. 4, once processing starts, a variable n is initialized to be 1 in Step S1, and then three sampling values An−1, An, and An+1 are extracted from a digital audio signal in Step S2.

In Step S3, the three sampling values are compared to one another, and if relationships An−1=An and An>An+1 hold true at the same time (Yes), the value of An is extracted as a peak value in Step S4. Moreover, in Step S5, those three sampling values are compared to one another, and if relationships An−1<An and An>An+1 hold true at the same time (Yes), the value of An is extracted as a peak value in Step S4. As a result, the peak value of an original signal is detected and held.

Figure 5:
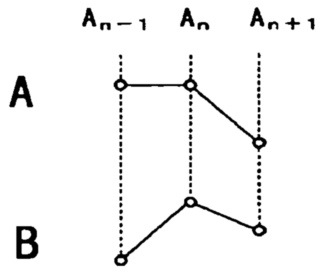
FIG. 5 shows a wave form for explanation of the processing.

That is, in Steps S3 and S5, the value of An is extracted when the peaks shown in FIGS. 5A and 5B are found in the current signal. In Step S6, whether or not the processing is completed is determined, and if it is found completed, it is ended. Moreover, when it is not yet completed, the value of n is incremented by one in Step S7, and then the processing returns to Step S2. In such a procedure, processing for detecting and holding the peak value of an original signal is repeated in every digital audio signal sampling period.

Therefore, according to the structure described above, the peak value detection and holding circuit 2 may be implemented only through simple comparison processing. Such a peak value detection and holding circuit 2 may be implemented without becoming a burden of the central processing circuit (CPU). As a result, apparatus for displaying images, for example, may be additionally able to carry out the high frequency signal interpolation according to the present invention.

Furthermore, the high pass filter 3 and the low pass filter 5 may also be easily formed using a digital filter, such as a FIR (Finite duration Impulse Response) filter.

Note that while the low pass filter 5, which removes high frequency components from an original signal, is arranged in FIG. 1, it may be unnecessary when a digital audio signal provided to the input terminal 1 has gone through a low pass filter.

According to the high frequency signal interpolation apparatus of the present invention, a peak value is detected from an original signal, a square wave is generated by holding the detected peak value, a higher harmonic component is extracted from the generated square wave and added to the original signal, which are all implemented by a very simple processing structure, thereby providing quality, high frequency signal and practical, high frequency signal interpolation. Note that the present invention is not limited to the embodiment described above, and various modifications thereof are possible within the scope which does not deviate from the claimed invention.

The invention claimed is:

1. A high frequency signal interpolation apparatus comprising:

a peak value detection and holding circuit configured to detect numerous peak values of an original audio signal and output a square wave signal, an amplitude of the square wave signal being held at one of the peak values until a subsequent one of the peak values is detected, said one of the peak values being a maximum amplitude of the original audio signal in a segment of the original audio signal, and said subsequent one of the peak values being a maximum amplitude of the original audio signal in a subsequent segment of the original audio signal; and a high pass filter configured to remove a higher harmonic component from said square wave signal, an extracted higher harmonic component being said higher harmonic component that has been removed from said square wave signal.

2. The high frequency signal interpolation apparatus according to claim 1, further comprising:

an adder configured to add said extracted higher harmonic component to a low pass signal, an interpolated high frequency signal being the sum of said extracted higher harmonic component and said low pass signal.

3. The high frequency signal interpolation apparatus according to claim 2, further comprising:

a low pass filter configured to remove a high frequency component from said original audio signal, said low pass signal being said original audio signal with said high frequency component removed.

4. The high frequency signal interpolation apparatus according to claim 3, further comprising:

a delay circuit configured to delay said original audio signal by a processing time, said original audio signal subsequent to delay being output to said low pass filter.

5. The high frequency signal interpolation apparatus according to claim 4, wherein said processing time is the length of time to detect a peak value of the numerous peak values.

6. The high frequency signal interpolation apparatus according to claim 1, wherein said peak value detection and holding circuit is configured to sample amplitudes of the original audio signal.

7. The high frequency signal interpolation apparatus according to claim 6, wherein said maximum one of the amplitudes in the segment is one of the amplitudes that is greater than a subsequent one of the amplitudes but not less than a previous one of the amplitudes.

8. The high frequency signal interpolation apparatus according to claim 1, wherein said peak value detection and holding circuit is configured to receive said original audio signal from an input terminal, said original audio signal at said input terminal not including a high frequency component.

* * * * *